United States Patent [19]

Uhlenhoff

[11] Patent Number: 4,621,338
[45] Date of Patent: Nov. 4, 1986

[54] CMOS ADDER USING EXCLUSIVE OR AND/OR EXCLUSIVE-NOR GATES

[75] Inventor: Arnold Uhlenhoff, Emmendingen, Fed. Rep. of Germany

[73] Assignee: ITT Industries, Inc., New York, N.Y.

[21] Appl. No.: 600,169

[22] Filed: Apr. 13, 1984

[30] Foreign Application Priority Data

Apr. 15, 1983 [EP] European Pat. Off. ........ 83103653.8

[51] Int. Cl.$^4$ .............................................. G06F 7/50
[52] U.S. Cl. ................................... 364/784; 364/786
[58] Field of Search ........................ 364/784, 785, 786

[56] References Cited

U.S. PATENT DOCUMENTS

| | | | |
|---|---|---|---|
| 3,767,906 | 10/1973 | Pryor | 364/784 |
| 4,039,858 | 8/1977 | Stewart | 307/231 |
| 4,052,604 | 10/1977 | Maitland et al. | 364/786 |
| 4,547,863 | 10/1985 | Colardelle | 364/784 |
| 4,564,921 | 1/1986 | Suganuma | 364/786 |

Primary Examiner—David H. Malzahn
Attorney, Agent, or Firm—Donald J. Lenkszus

[57] ABSTRACT

To implement CMOS EXORs or EXNORs, four transistors are used which have one end of their channels tied to the gate output. The first and fourth transistors are one one conductivity type, and the second and third transistors are of the other conductivity type. One of the inputs is split up into two sub-inputs to which one of the digital signals has to be applied in univerted form and in inverted form, respectively. The other end of the channel of the fourth transistor is connected to the first sub-input in the case of the EXOR and to the second sub-input in the case of the EXNOR. The reverse is true for the channel of the third transistor, while the channels of the first and second transistors are connected to the second input. The latter is also connected to the gates of the third and fourth transistors. The gate of the first transistor is connected to the channel of the fourth transistor, while the gate of the second transistor is connected to the channel of the third transistor.

3 Claims, 6 Drawing Figures

CMOS ADDER USING EXCLUSIVE OR AND/OR EXCLUSIVE-NOR GATES

BACKGROUND OF THE INVENTION

This invention pertains to exclusive-OR and exclusive-NOR gates implemented using complementary metal-oxide-semiconductor (CMOS) technology.

The terms exclusive-OR and exclusive-NOR are hereinafter abbreviated to "EXORs" and "EXNORs", respectively.

Prior arrangements are shown for EXORs in the German Patent Specification No. DE 21 65 160 C2, particularly FIG. 4A, and for EXNORs in the German Auslegeschrift No. DE 21 65 162 B2, particularly FIG. 4A. The prior art arrangement for each of the two gates has five transistors one of which has one end of its channel (source-drain path) connected to the DC supply voltage.

SUMMARY OF THE INVENTION

One object of the invention is to provide a CMOS circuit for EXORs or EXNORs which requires fewer transistors than the prior art arrangement, and CMOS full-adder stages using using EXORs and EXNORs.

An advantage of the invention over the prior art arrangements lies in the fact that only four transistors are required for each EXOR or EXNOR, so that one fifth of the otherwise required chip area can be saved. The invention also eliminates the need for the DC-supply-voltage-terminal, so that the EXORs and EXNORs in accordance with the invention can be used within the semiconductor chip without regard to the location of the supply-voltage lead.

To implement CMOS EXORs or EXNORs, four transistors are used which have one end of their channels tied to the gate output. The first and fourth transistors are of one conductivity type, and the second and third transistors are of the other conductivity type. One of the inputs is split up into two sub-inputs to which one of the digital signals has to be applied in uninverted form and in inverted form, respectively. The other end of the channel of the fourth transistor is connected to the first sub-input in the case of the EXOR and to the second sub-input in the case of the EXNOR. The reverse is true for the channel of the third transistor while the channels of the first and second transistors are connected to the second input. The latter is also connected to the gates of the third and fourth transistors. The gate of the first transistor is connected to the channel of the fourth transistor while the gate of the second transistor is connected to the channel of the third transistor.

BRIEF DESCRIPTION OF THE DRAWINGS

The invention will now be explained in more detail with reference to the accompanying drawings, in which.

DETAILED DESCRIPTION

Figure 1:
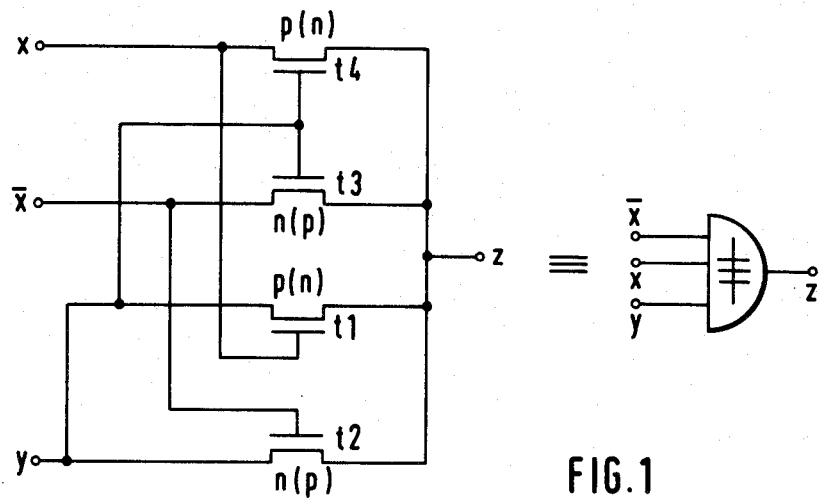
FIG. 1 is a circuit diagram of the EXOR in accordance with the invention and the logic symbol used hereinafter for this gate.
Figure 2:
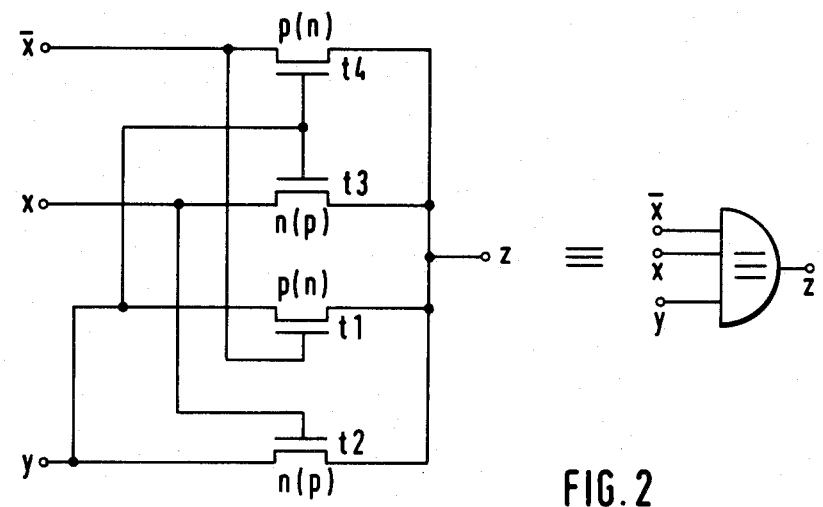
FIG. 2 is a circuit diagram of the EXNOR in accordance with the invention and the logic symbol for this gate.

First, the differences of the invention from the prior art arrangements will be explained with the aid of FIGS. 1 and 2. The EXOR or EXNOR consists of the four transistors t1, t2, t3, t4, of which the two transistors t1, t4 are of one conductivity type. In FIG. 1, they are assumed to be p-channel devices, the letter in brackets indicating that they may also be n-channel devices. The two transistors t2, t3 are of the other conductivity type, i.e., n-channel devices. The p in brackets indicates that p-type conductivity is also possible. The invention thus differs from the prior art arrangement in that, according to one feature of the invention, the second transistor t2, which is of said one conductivity type in the prior art, is of the other conductivity type in the invention.

According to another feature of the invention, unlike the prior art arrangement, the gate of the fourth transistor t4 is connected to the second input y, not to the first sub-input x. Furthermore, the channel terminal of the transistor t4 not coupled to the output is connected to the first sub-input x in the case of the EXOR and to the second sub-input $\bar{x}$ in the case of the EXNOR, not to the second input y as in the prior art arrangement.

According to a further feature of the invention, the gate of the first transistor t1 is connected to the above-mentioned terminal of the channel of the fourth transistor t4, not to the gate of this transistor t4 as in the prior art arrangement. The channel terminal of the first transistor t1 not coupled to the output is connected to the second input y directly, not through the gate-source path of the above-mentioned fifth transistor as in the prior art arrangement. In the case of the EXOR, the channel terminal of the third transistor t3 not coupled to the output is connected to the second sub-input $\bar{x}$, not to the first sub-input as in the prior art arrangement.

The figures will now be explained in detail without considering the differences from the prior art mentioned hereinabove. The first input of each of the two gates is divided into the first sub-input x and the second sub-input $\bar{x}$, to which two sub-inputs one of the two digital signals has to be applied in uninverted form and inverted form, respectively, while the second input y for the other digital signal is undivided, and the digital signal has to be applied to it in uninverted form. In the logic symbols used in FIGS. 1 to 4, this property is indicated graphically by the fact that the two sub-inputs x,$\bar{x}$ are closer together than the sub-input x and the second input y.

The channels of all four transistors t1 . . . t4 are tied to the gate output z. The gate of the first transistor t1, which is of one conductivity type, is connected to the first sub-input x in the case of the EXOR, and to the second sub-input $\bar{x}$ in the case of the EXNOR. The gate of the second transistor t2, which is of the other conductivity type, is connected to the second sub-input $\bar{x}$ in the case of the EXOR, and to the first sub-input x in the case of the EXNOR. The gate of the third transistor t3, which is of the other conductivity type, and that of the fourth transistor t4, which is of said one conductivity type, are connected to the second input y both in the case of the EXOR and in the case of the EXNOR.

The channel terminals of the first and second transistors t1, t2 not coupled to the output are connected to the second input y, while the corresponding terminal of the third transistor t3 is connected to the second sub-input $\overline{x}$ in the case of the EXOR and to the first sub-input x in the case of the EXNOR. The corresponding terminal of the fourth transistor t4 is connected to the first sub-input x in the case of the EXOR and to the second sub-input $\overline{x}$ in the case of the EXNOR.

Figure 3:
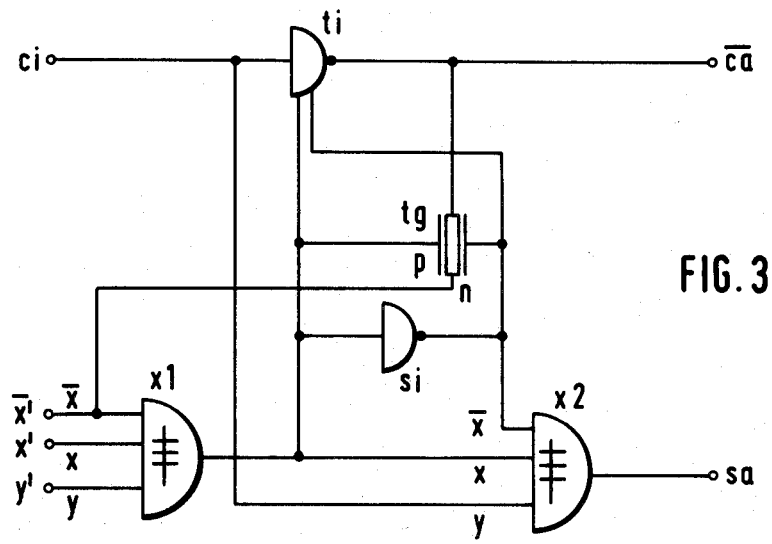
FIG. 3 is a schematic diagram of a first CMOS full-adder stage using the invention.
Figure 4:
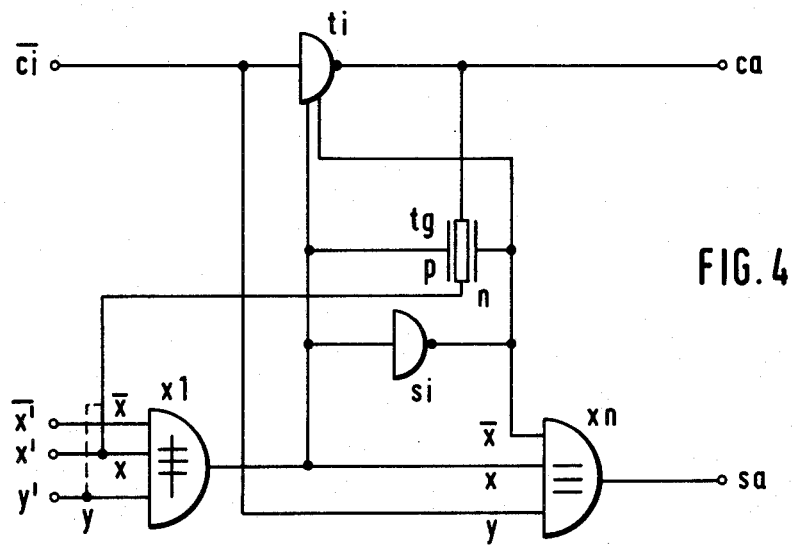
FIG. 4 is a schematic diagram of a second CMOS full-adder stage using the invention.

Because of the small number of transistors required in the EXORs and EXNORs in accordance with the invention, these gates are especially suited for incorporation in CMOS full-adder stages. Two embodiments of such an application of the invention are shown in FIGS. 3 and 4. FIG. 3 relates to a full-adder stage in which the carry input ci is intended for an uninverted carry signal, while the carry output $\overline{ca}$ provides an inverted carry signal. In FIG. 4, these two features are interchanged, i.e., the carry input $\overline{ci}$ is intended for an inverted carry signal, while the carry output ca provides an uninverted carry signal.

The two full-adder stages to be described differ in that the stage of FIG. 3 uses two EXORs, x1 and x2, in accordance with the invention while in the stage of FIG. 4, the EXOR x2 has been replaced by the EXNOR xn. Since the inputs of the first EXOR x1 are also the inputs of the respective full-adder stage, the first input of the adder, too, is divided into the two sub-inputs x' and $\overline{x}$', while the second input y' is undivided. It is obvious that, since these two inputs are identical with the first and second sub-inputs x and $\overline{x}$, respectively, of the EXNOR, the first signal to be added must be applied to them in uninverted form and inverted form, respectively, while the second signal to be added must be applied to the second input y' in uninverted form.

The first sub-inputs x of the second EXOR x2 (FIG. 3) and the EXNOR xn (FIG. 4) are connected to the output of the first EXOR x1, while the carry inputs ci (FIG. 3) and $\overline{ci}$ (FIG. 4) are connected to the second inputs y of the second EXOR x2 and the EXNOR xn, respectively. The carry inputs ci and $\overline{ci}$ are connected through the clocked inverters ti to the carry outputs $\overline{ca}$ (FIG. 3) and ca (FIG. 4), respectively.

The output of the first EXOR x1 is also coupled to the input of the static inverter si, to the first clock input of the clocked inverter ti, and to the first clock input of the transmission gate tg, whose second clock input, together with the second clock input of the clocked inverter ti, is connected to the output of the static inverter si. For the conductivities of the four transistors t1 . . . t4 given outside the brackets in FIGS. 1 and 2, the left-hand transistor of the transmission gate tg in FIGS. 3 and 4 is of said one conductivity type, i.e., a p-channel device, and the right-hand transistor is of the other conductivity type, i.e., an n-channel device.

The switching path of the transmission gate tg is connected between the second sub-input $\overline{x}$' and the carry output $\overline{ca}$ in the case of the full-adder stage of FIG. 3, and between the first sub-input x' or the second input y', this is indicated by a broken line, and the carry output ca in the case of the full-adder stage of FIG. 4. In FIG. 3, the output of the second EXOR x2 is the sum output sa; in FIG. 4, the sum output is the output of the EXNOR xn.

Figure 5:
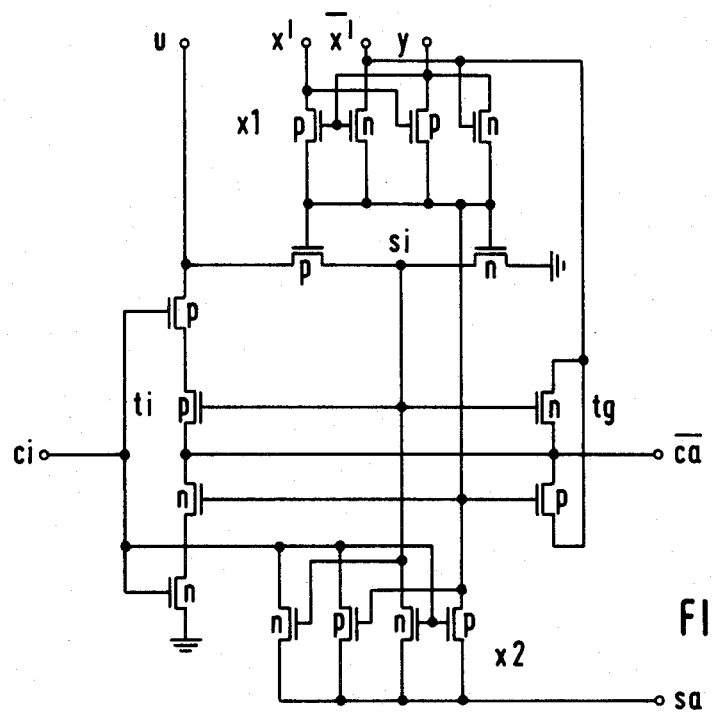
FIG. 5 is a detailed circuit diagram of the CMOS full-adder stage of FIG. 3.
Figure 6:
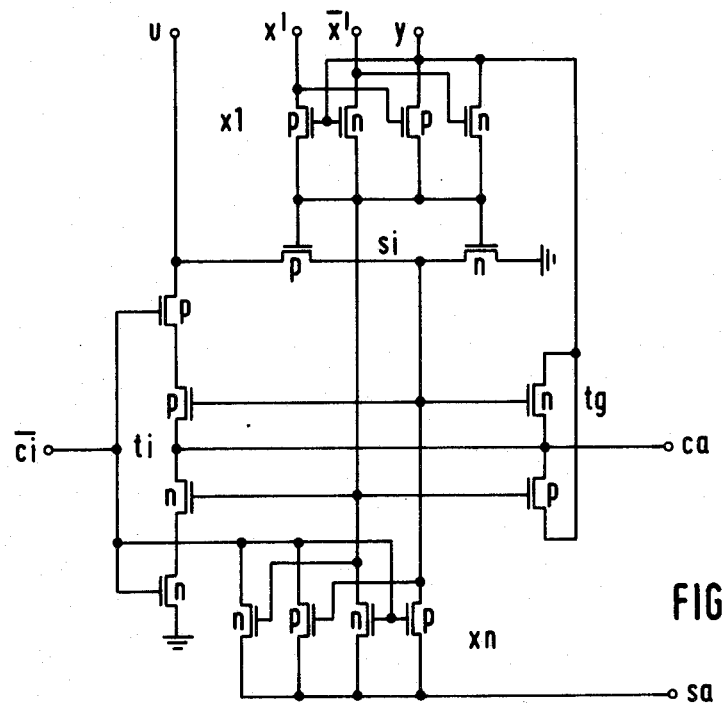
FIG. 6 is a detailed circuit diagram of the CMOS full-adder stage of FIG. 4.

FIGS. 5 and 6 show detailed circuit diagrams of the arrangements of FIGS. 3 and 4, respectively. In the EXORs and EXNORs x1, x2, and xn, the reference characters of the individual transistors have been omitted for the sake of clarity. As the circuits are sufficiently clear from the interconnections and the input designations, such reference characters are not necessary. In FIGS. 5 and 6 it can be seen that the clocked inverter ti consists of four transistors in series of which the "upper" two are of one conductivity type and the "lower" two of the other, and whose series-connected channels are connected between the supply voltage u and ground. The grounded transistor and the transistor connected to the supply voltage u have their gates interconnected and, thus, are the inverter transistors proper, while the two "inner" transistors are the transistors serving to inject the first and second clock signals, respectively.

Also connected to the supply voltage u and to ground is the static inverter si, which, as usual, consists of two transistors of opposite conductivity type having their channels connected in series between ground and the supply voltage u. The transmission gate tg consists, as usual, of two transistors of opposite conductivity type having their channels connected in parallel.

As may be seen, each of the two full-adder stages of FIGS. 5 and 6 consists of sixteen transistors half of which is of one conductivity type and the other half of the other, i.e., the circuit uses the same number of transistors of each conductivity type.

If a full-adder stage as shown in FIG. 5 and a full-adder stage as shown in FIG. 6 are connected in series with respect to the carry-signal path, and the circuit of FIG. 6 is followed by a circuit as shown in FIG. 5, and so forth, a CMOS parallel adder is obtained in which the carry-signal path of each stage contains only a single inverter. Thus, such a full adder is a so-called ripple-carry adder, i.e., an adder with an especially rapid carry generation time.

What is claimed is:

1. A CMOS full-adder stage having first inputs including two sub-inputs for a first signal to be added and a second input for a second signal to be added, and with a carry input for an uninverted carry signal, comprising:
   first and second exclusive-OR (EXOR) gate implemented using complementary metal-oxide-semiconductor technology (CMOS technology), each comprising:
   a first sub-input of a first input and an associated second sub-input for receiving inverted and uninverted two sub-inputs for one digital signal, respectively;
   a second input for receiving a second digital signal in uninverted form;
   a first transistor of one conductivity type having its gate connected to said first sub-input;
   a second transistor having its gate connected to said second sub-input;
   a third transistor of a second conductivity type having its gate connected to said second input;
   a fourth transistor of said one conductivity type;
   a gate output coupled to one channel terminal of each of said first, second, third and fourth transistors;
   a second channel terminal of said second transistor being connected to said second input;
   a second channel terminal of said third transistor being connected to said second sub-input;
   said second transistor being of said second conductivity type;
   the gate of said fourth transistor being connected to said second input;
   the second channel terminal of said fourth transistor being connected to said first sub-input;

the gate of said first transistor being connected to the second channel terminal of said fourth transistor; and the second channel terminal of said first transistor being connected to said second input, said stage further comprising:

a clocked inverter;

a static inverter;

a transmission gate;

wherein said first signal to be added is applied to said first sub-input and said second sub-input of said first EXOR in uninverted form and inverted form, respectively, and said second signal to be added is applied to said second input of said first EXOR;

said first sub-input of said second EXOR is connected to said output of said first EXOR;

said carry input is connected to said second input of said second EXOR and to the signal input of said clocked inverter;

said output of said first EXOR is connected to the input of said static inverter, to the first clock input of said clocked inverter, and to the first clock input of said transmission gate;

the second clock input of said transmission gate together with the second clock input of said clocked inverter being connected to the output of said static inverter;

the output of said clocked inverter is the carry output;

the output of said second EXOR being the sum output; and the switching path of said transmission gate is connected between said second sub-input and said carry output.

2. A CMOS full-adder stage with a first input consisting of two sub-inputs for a first signal to be added and a second input for a second signal to be added, and with a carry input for an inverted carry signal, comprising:

a clocked inverter;

a static inverter;

a transmission gate;

an exclusive OR (EXOR) gate;

an exclusive NOR (EXNOR) gate;

said EXOR gate comprising;

a first sub-input of a first input and an associated second sub-input for receiving inverted and uninverted sub-inputs for one digital signal, respectively;

a second input for receiving a second digital signal in uninverted form;

a first transistor of one conductivity type having its gate connected to said first sub-input;

a second transistor having its gate connected to said second sub-input;

a third transistor of a second conductivity type having its gate connected to said second input;

a fourth transistor of said one conductivity type;

a gate output coupled to one channel terminal of each of said first, second, third and fourth transistors;

a second channel terminal of said second transistor being connected to said second input;

a second channel terminal of said third transistor being connected to second sub-input;

said second transistor being of said second conductivity type;

the gate of said fourth transistor being connected to said second input the second channel terminal of said fourth transistor being connected to said first sub-input;

the gate of said first transistor being connected to the second channel terminal of said fourth transistor; and the second channel terminal of said first transistor being connected to said second input;

said EXNOR gate comprising:

a first sub-input of a first input and an associated second sub-input for receiving inverted and uninverted sub-inputs for one digital signal respectively;

a second input for receiving a second digital signal in uninverted form;

a first transistor of one conductivity type having its gate connected to said second sub-input;

a second transistor having its gate connected to said first sub-input;

a third transistor of a second conductivity type having its gate connected to said second input;

a fourth transistor of said one conductivity type;

a gate output coupled to one channel terminal of each of said first, second, third and fourth transistors;

a second channel terminal of said second transistor being connected to said second input;

a second channel terminal of said third transistor being connected to said first sub-input;

said second transistor being of said second conductivity type;

the gate of said fourth transistor being connected to said second input;

the second channel terminal of said fourth transistor being connected to said second sub-input;

the gate of said first transistor being connected to the second channel terminal of said fourth transistor;

and the second terminal of said first transistor being connected to the second input, and wherein;

said first signal to be added is applied to said first sub-input and said second sub-input of said EXOR in uninverted form and inverted form, respectively, and said second signal to be added is applied to said second input of said EXOR;

said first sub-input of said EXNOR is connected to the output of said EXOR;

said carry input is connected to said second input of said EXNOR and to the signal input of said clocked inverter;

the output of said EXOR is connected to the input of said static inverter to a first clock input of said clocked inverter, and to a first clock input of said transmission gate;

a second clock input of said transmission gate, together with a second clock input of said clocked inverter being connected to the output of said static inverter;

the output of said clocked inverter is the output for an uninverted carry signal, and the output of said EXNOR is the sum output; and the switching path of said transmission gate is connected between the first sub-input or the second input of said EXOR and the carry output.

3. A CMOS parallel adder comprising:

a plurality of full adder stages each having its carry output coupled to the carry input of the next stage;

alternate ones of said plurality of stages being of a first type and intermediate ones of said plurality of stages being of a second type;

each said first type stage being a CMOS full-adder stage having first inputs including two sub-inputs for a first signal to be added and a second input for a second signal to be added, and with a carry input for an uninverted carry signal, comprising:

first and second exclusive-OR (EXOR) gate implemented using complementary metal-oxide-semiconductor technology (CMOS technology), each comprising:

a first sub-input of a first input and an associated second sub-input for receiving inverted and uninverted two sub-inputs for one digital signal, respectively;

a second input for receiving a second digital signal in uninverted form;

a first transistor of one conductivity type having its gate connected to said first sub-input;

a second transistor having its gate connected to said second sub-input;

a third transistor of a second conductivity type having its gate connected to said second input;

a fourth transistor of said one conductivity type;

a gate output coupled to one channel terminal of each of said first, second, third and fourth transistors;

a second channel terminal of said second transistor being connected to said second input;

a second channel terminal of said third transistor being connected to said second sub-input;

said second transistor being of said second conductivity type;

the gate of said fourth transistor being connected to said second input;

the second channel terminal of said fourth transistor being connected to said first sub-input;

the gate of said first transistor being connected to the second channel terminal of said fourth transistor; and the second channel terminal of said first transistor being connected to said second input said stage further comprising:

a clocked inverter;

a static inverter;

a transmission gate;

wherein said first signal to be added is applied to said first sub-input and said second sub-input of said first EXOR in uninverted form and inverted form, respectively, and said second signal to be added is applied to said second input of said first EXOR;

said first sub-input of said second EXOR is connected to said output of said first EXOR;

said carry input is connected to said second input of said second EXOR and to the signal input of said clocked inverter;

said output of said first EXOR is connected to the input of said static inverter, to the first clock input of said clocked inverter, and to the first clock input of said transmission gate;

the second clock input of said transmission gate together with the second clock input of said clocked inverter being connected to the output of said static inverter;

the output of said clocked inverter is the carry output;

the output of said second EXOR being the sum output; and the switching path of said transmission gate is connected between said second sub-input and said carry output;

each said second type stage being a CMOS full-adder stage with a first input consisting of two sub-inputs for a first signal to be added and a second input for a second signal to be added, and with a carry input for an inverted carry signal, comprising:

a clocked inverter;

a static inverter;

a transmission gate;

an exclusive OR (EXOR) gate;

an exclusive NOR (EXNOR) gate;

said EXOR gate comprising:

a first sub-input of a first input and an associated second sub-input for receiving inverted and uninverted sub-inputs for one digital signal, respectively;

a second input for receiving a second digital signal in uninverted form;

a first transistor of one conductivity type having its gate connected to said first sub-input;

a second transistor having its gate connected to said second sub-input;

a third transistor of a second conductivity type having its gate connected to said second input;

a fourth transistor of said one conductivity type;

a gate output coupled to one channel terminal of each of said first, second, third and fourth transistors;

a second channel terminal of said second transistor being connected to said second input;

a second channel terminal of said third transistor being connected to second sub-input;

said second transistor being of said second conductivity type;

the gate of said fourth transistor being connected to said second input the second channel terminal of said fourth transistor being connected to said first sub-input;

the gate of said first transistor being connected to the second channel terminal of said fourth transistor; and the second channel terminal of said first transistor being connected to said second input;

said EXNOR gate comprising:

a first sub-input of a first input and an associated second sub-input for receiving inverted and uninverted sub-inputs for one digital signal respectively;

a second input for receiving a second digital signal in uninverted form;

a first transistor of one conductivity type having its gate connected to said second sub-input;

a second transistor having its gate connected to said first sub-input;

a third transistor of a second conductivity type having its gate connected to said second input;

a fourth transistor of said one conductivity type;

a gate output coupled to one channel terminal of each of said first, second, third and fourth transistors;

a second channel terminal of said second transistor being connected to said second input;

a second channel terminal of said third transistor being connected to said first sub-input;

said second transistor being of said second conductivity type;

the gate of said fourth transistor being connected to said second input;

the second channel terminal of said fourth transistor being connected to said second sub-input;

the gate of said first transistor being connected to the second channel terminal of said fourth transistor;

and the second terminal of said first transistor being connected to the second input, and wherein;

said first signal to be added is applied to said first sub-input and said second sub-input of said EXOR in uninverted form and inverted form, respectively, and said second signal to be added is applied to said second input of said EXOR;

said first sub-input of said EXNOR is connected to the output of said EXOR;

said carry input is connected to said second input of said EXNOR and to the signal input of said clocked inverter;

the output of said EXOR is connected to the input of said static inverter to a first clock input of said clocked inverter, and to a first clock input of said transmission gate;

a second clock input of said transmission gate, together with a second clock input of said clocked inverter being connected to the output of said static inverter;

the output of said clocked inverter is the output for an uninverted carry signal, and the output of said EXNOR is the sum output; and the switching path of said transmission gate is connected between the first sub-input or the second input of said EXOR and the carry output.

* * * * *